United States Patent
Verma et al.

(10) Patent No.: US 7,382,027 B2
(45) Date of Patent: Jun. 3, 2008

(54) MOSFET DEVICE WITH LOW GATE CONTACT RESISTANCE

(75) Inventors: Purakh Raj Verma, Singapore (SG); Sanford Chu, Singapore (SG); Lap Chan, Singapore (SG); Yelehanka Pradeep, Singapore (SG); Kai Shao, Shanghai (CN); Jia Zhen Zheng, Singapore (SG)

(73) Assignee: Chartered Semiconductor Manufacturing, Ltd., Singapore (SG)

( * ) Notice: Subject to any disclaimer, the term of this patent is extended or adjusted under 35 U.S.C. 154(b) by 99 days.

(21) Appl. No.: 11/045,958

(22) Filed: Jan. 28, 2005

(65) Prior Publication Data

US 2005/0136573 A1 Jun. 23, 2005

Related U.S. Application Data

(62) Division of application No. 10/664,211, filed on Sep. 17, 2003, now Pat. No. 6,861,317.

(51) Int. Cl.
| | |
|---|---|
| *H01L 29/76* | (2006.01) |
| *H01L 29/94* | (2006.01) |
| *H01L 31/062* | (2006.01) |
| *H01L 31/113* | (2006.01) |
| *H01L 31/119* | (2006.01) |

(52) U.S. Cl. .................. 257/369; 257/374; 257/E27.06
(58) Field of Classification Search ........ 257/368–369, 257/374, 337, 900, E27.06
See application file for complete search history.

(56) References Cited

U.S. PATENT DOCUMENTS

| 5,731,239 | A | 3/1998 | Wong et al. | ................. 438/296 |
| 6,010,954 | A | 1/2000 | Ho et al. | .................... 438/596 |
| 6,271,087 | B1 | 8/2001 | Kinoshita et al. | ........... 438/258 |
| 6,281,059 | B1 | 8/2001 | Cheng et al. | ................ 438/200 |
| 6,326,651 | B1 * | 12/2001 | Manabe | ...................... 257/209 |

* cited by examiner

*Primary Examiner*—Hoai v Pham
(74) *Attorney, Agent, or Firm*—Horizon IP Pte Ltd

(57) ABSTRACT

A CMOS RF device and a method to fabricate said device with low gate contact resistance are described. Conventional MOS transistor is first formed with isolation regions, poly-silicon gate structure, sidewall spacers around poly gate, and implanted source/drain with lightly and heavily doped regions. A silicon dioxide layer such as TEOS is deposited, planarized with chemical mechanical polishing (CMP) to expose the gate and treated with dilute HF etchant to recess the silicon dioxide layer below the surface of the gate. Silicon nitride is then deposited and planarized with CMP and then etched except around the gates, using a oversize poly-silicon gate mask. Inter-level dielectric mask is then deposited, contact holes etched, and contact metal is deposited to form the transistor. During contact hole etch over poly-silicon gate, silicon nitride around the poly gate acts as an etch stop. Resulting structure with direct gate contact achieves significantly reduced gate resistance and thereby improved noise performance at high frequency operation, increased unit power gain frequency ($f_{max}$), and reduced gate delay.

23 Claims, 3 Drawing Sheets

MOSFET DEVICE WITH LOW GATE CONTACT RESISTANCE

This is a division of patent application Ser. No. 10/664,211, filing date Sep. 17, 2003, now U.S. Pat. No. 6,861,317 A Method Of Making Direct Contact On Gate By Using Dielectric Stop Layer, assigned to the same assignee as the present invention, which is herein incorporated by reference in its entirety.

BACKGROUND OF THE INVENTION (1) Field of the Invention

The present invention relates generally to a method of forming a semiconductor device, and more particularly to form low resistance gate contacts in a MOSTET device.

(2) Description of the Prior Art

There has been increasing interest in the possible use of CMOS (complimentary metal-oxide-silicon) circuits for RF applications at >900 MHz, such as mobile telecommunication devices. The reasons for this are: low fabrication cost of CMOS devices compared to the currently used bipolar and GaAs integrated circuits (IC), easy integration of analog and digital components, and fundamental advantages if attainable dynamic range when a frequency mixer is required in specific applications. Furthermore, the cut-off frequency of small geometry MOSFET has become comparable to that of advanced bipolar transistors. In addition, minimum noise figure (NFmin) has also improved in the submicron devices. For these reasons, CMOS devices will be increasingly used in RF front-end IC's.

In the case of high-frequency analog MOSFET's, while high trans-conductance is important for high cut-off frequency and low noise characteristic, low gate resistance is essential for reducing thermal noise. In advanced device designs enabled by advances in process technologies, minimum feature sizes are continually decreasing. As a result, channel lengths in FET devices and thereby gate electrode widths have significantly decreased. One major problem associated with narrow gate electrode is its high electrical sheet resistance which impairs the device performance. Several methods have been proposed and used in prior art for reducing gate resistance. One method is to divide the gate electrode into several gate fingers, with each finger having provided with a contact hole, thereby increasing the total gate contact area. Another method is to use metal silicide contacts such as titanium, tungsten, or cobalt silicides or metal gates. The present invention proposes an alternate method of reducing gate contact resistance by directly contacting the gate poly-silicon with the contact metal.

U.S. Pat. No. 5,731,239 describes a method for making low sheet resistance sub-quarter micrometer gate electrode in FET devices. The method involves first patterning the gate from a doped poly-silicon layer. After forming the sidewall spacers and source/drain contact regions with Ti contacts, the insulating layer is chemically mechanically polished to the silicon nitride on the gate electrode layer. A pre-amorphizing implantation is done and a titanium silicide is selectively formed on the gate electrodes resulting in small grain sizes and reduced sheet resistance. Alternatively, cobalt silicide can also be formed on gate electrode to reduce the gate resistance.

U.S. Pat. No. 6,010,945 describes a method to form a "mushroom shaped" gate structure that increases the top gate silicide contact area and improves the salicidation process. The upper gate extensions increase the top gate surface area so that silicide gate contacts will have low resistivity.

U.S. Pat. No. 6,271,087 B1 describes a method for forming self-aligned contacts and local interconnects. Multi-layer structures are formed on a semiconductor substrate; sidewall spacers are formed around the multi-layer structures; source and drain regions are formed; a stop layer is deposited over the substrate followed by the deposition of a dielectric layer over said stop layer. A first photo-resist contact mask is used to etch core contact and peripheral local interconnect openings. After stripping the first mask, a second contact mask is formed and the multi-layer structures are etched to form local interconnect openings. After removing the second mask, a conductive film is deposited over the dielectric layer and in the core and peripheral openings, followed by chemical mechanical polishing to remove the conductive film everywhere except in the core contact and local interconnect openings.

U.S. Pat. No. 6,281,059 B1 describes a method of forming ESD protective transistor. This is done by ion implantation into the drain contact hole of the ESD protective transistor, wherein the contact hole is fabricated simultaneously with gate contact holes of the fundamental transistor and the ESD protective transistor. Both of the transistors have a respective metal silicide layer to cap the poly-silicon layer to prevent penetration of $p^+$ ions into poly-silicon while implanting into the contact holes.

SUMMARY OF THE INVENTION

Accordingly, the main object of this invention is to describe a method of forming a MOSFET device with low resistance gate on a semiconductor substrate.

It is yet another object to describe a method to form low resistance gate contacts in a MOSFET device on a semiconductor substrate.

Another objective of the invention is to describe a MOSTET device with low resistance gate.

In accordance with these objectives, a CMOS RF device and a method to fabricate said device with low gate contact resistance are described. Conventional MOS transistor is first formed with isolation regions, gate structure, sidewall spacers, and implanted source/drain regions. An oxide layer like TEOS is deposited, planarized with chemical mechanical polishing (CMP) to expose the gate. Silicon nitride is then deposited and planarized with CMP, and then etched except around the gates using a gate poly-silicon oversize mask. Inter-level dielectric mask is then deposited; contact holes etched; and contact metal deposited to form the transistor. The resulting device structure achieves significantly reduced gate resistance.

BRIEF DESCRIPTION OF THE DRAWINGS

The objects, advantages, and details of fabricating a semiconductor device according to this invention will be more clearly understood from the following detailed description taken in conjunction with the accompanying drawings.

DETAILED DESCRIPTION OF THE INVENTION

Figure 1:
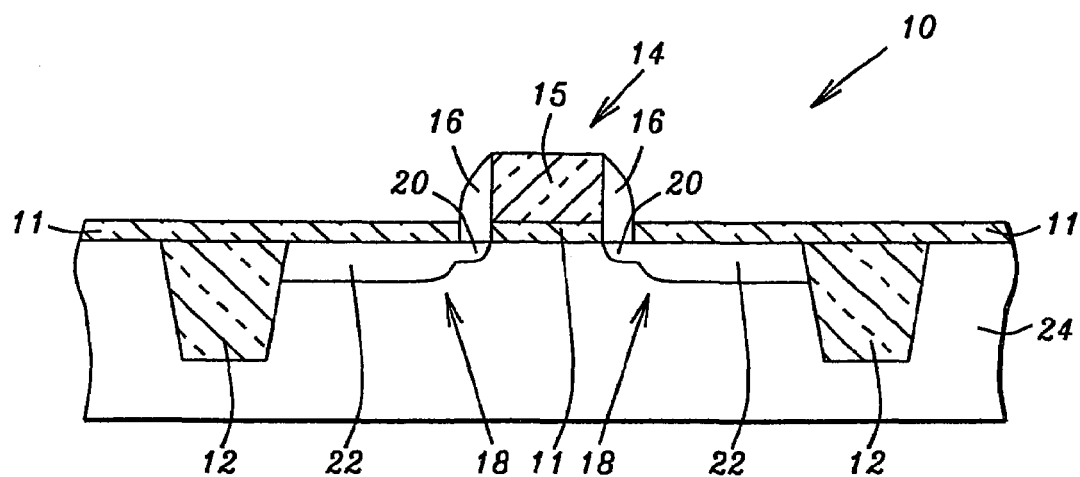
FIG. 1 is a cross-section of a MOSFET device showing isolation trenches, gate structure, sidewall passivation, and lightly and heavily doped source/drain regions.

The invention process begins with forming a dielectric layer over a MOSFET device known in prior art. Said MOSFET device 10, with its components—filled isolation trenches 12, gate structure 14 with gate poly-silicon 15, sidewall passivation 16, source/drain regions 18 with lightly doped 20 and heavily doped 22 regions shown in FIG. 1. For simplicity, only n-channel part of the CMOS device formed in a p-type silicon substrate 24 is shown. Said structure could be formed in a p-tub formed in n-type silicon substrate or an MOS device.

Figure 2:
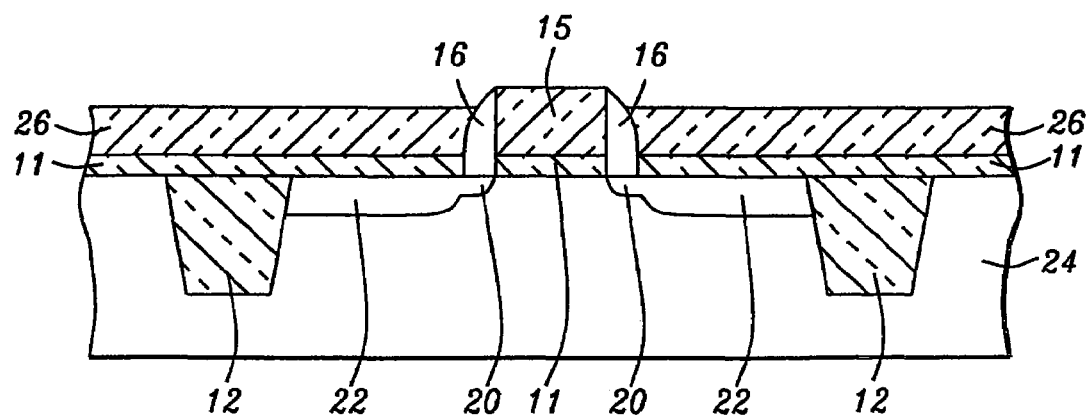
FIG. 2 is a cross-section of the MOSFET device after depositing a dielectric layer, planarization, and HF dip.

A dielectric layer 26, with a thickness of approximately between about 2000° A and 5000° A, comprising silicon dioxide, nitridized silicon dioxide, silicon oxy-fluoride (SiOF or FSG), tetra-ethyl-ortho-silicate (TEOS) is deposited using low pressure (LP) or plasma-enhanced (PE) chemical vapor deposition (CVD) methods known in prior art. Since the film is conformally deposited, the film covers the gate structures completely. The overburden is then planarized using a method comprising plasma etch back and/or chemical maechanical polishing. Planarization is done so as to expose the gate structures. The planarized wafer is subjected to a brief dilute HF dip so as to recess the oxide layer slightly below the gate structure, as shown in FIG. 2. Amount of step below the gate level is approximately between 500 A and 1000 A, depending upon the thickness of gate poly-silicon used.

Figure 3:
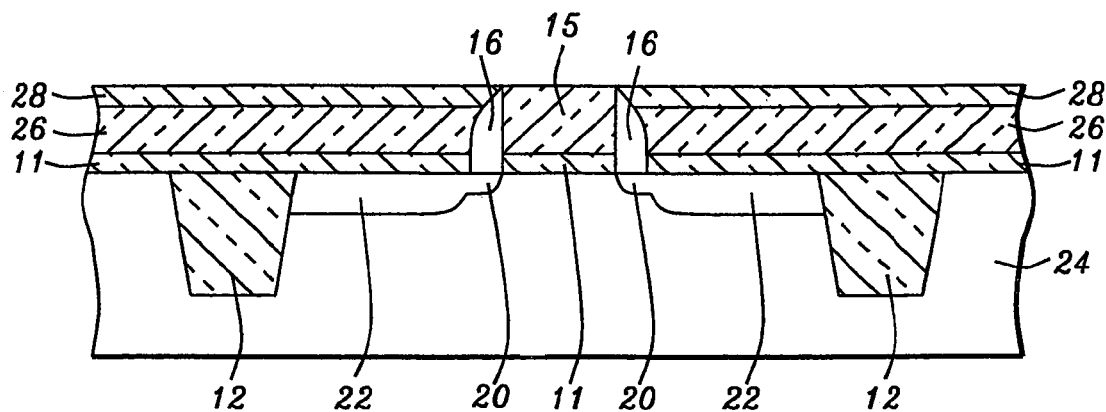
FIG. 3 is a cross-section of the MOSFET device after depositing a nitride layer and planarization.

A silicon nitride layer 28, with a thickness of approximately between about 1000° A and 2000° A, is deposited conformally and then planarized with CMP or etch back methods, to expose the gate structure as shown in FIG. 3. Although the preferred film is silicon nitride other films comprising oxygen doped silicon nitride, silicon oxy-nitride can alternatively be used.

Figure 4:
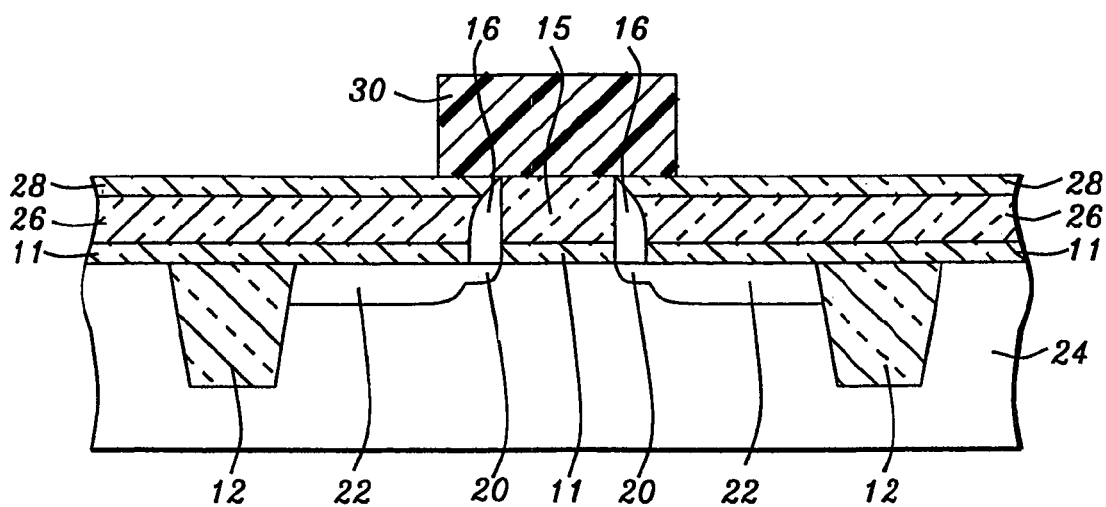
FIG. 4 is a cross-section of the MOSFET device after forming oversize mask over gate poly-silicon.

An oversize photo-resist mask 30, as shown in FIG. 4, is formed over the structure of FIG. 3, such that only the nitride around the gate structure 15 is preserved.

Figure 5:
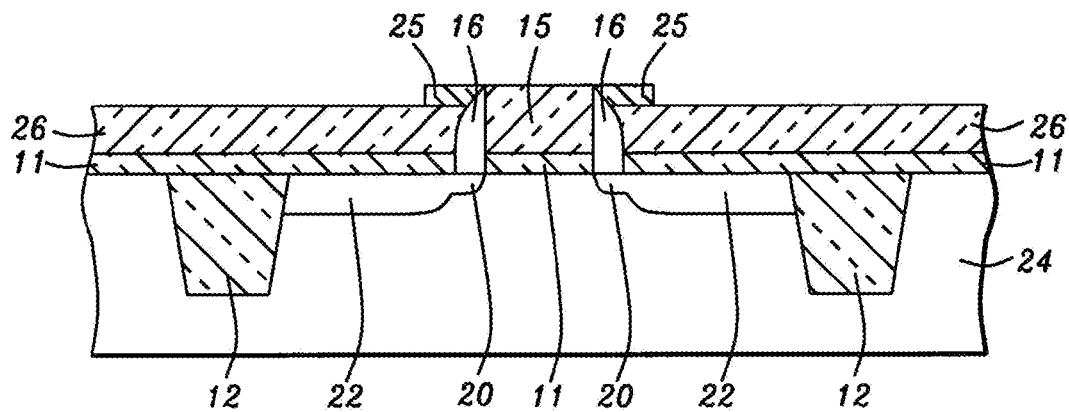
FIG. 5 is a cross-section of the MOSFET device after etching the nitride and mask removal.

Nitride film 28 is etched selectively such that etching stops on the under-lying oxide film, using a plasma etching process known in prior art. The selective etching process uses a mixture of halogen containing gases (e.g. F, Cl, or Br) at low ion bombardment energy typically less than about 100 eV. The resulting structure, after removing said resist mask, is shown in FIG. 5.

Figure 6:
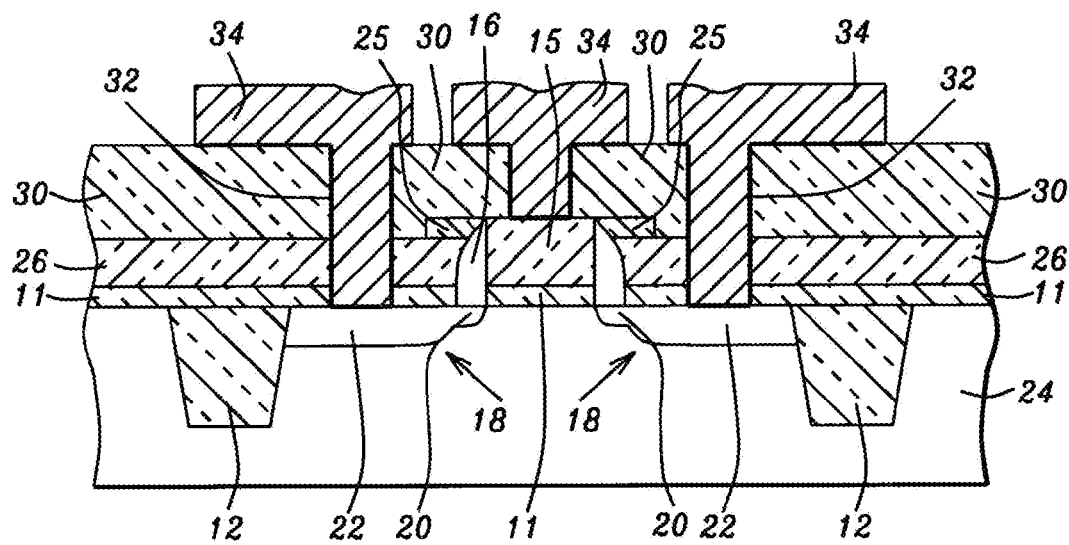
FIG. 6 is a cross-section of the MOSFET device showing inter-level dielectric layer with contact holes etched and contact metal deposited.

FIG. 6 shows the completed device after the inter-level dielectric film 30 is deposited; contact holes 32 are etched; and contact metal 34 deposited using processes known in prior art. Said inter-level dielectric film, with thickness approximately between 8,000 Å and 15,000 Å, comprises TEOS, borosilicate glass (BSG) and/or phosphorous silicate glass (PSG), deposited using LPCVD or PECVD method known in prior art. Un-etched nitride film surrounding the gate area acts as etch stop during etching gate contact hole over the gate structure, preserving the sidewall spacers 16.

The advantages of this invention over prior art are:
a) low resistance poly-silicon gate in a MOSFET structure,
b) improved high frequency noise performance in an RF CMOS device,
c) significant increase in maximum oscillation frequency and unit power gain frequency,
d) reduced RC gate delay

What is claimed is:

1. A MOSFET device structure comprising:
   a semiconductor substrate having device elements comprising isolation structures, a gate structure comprising a gate, sidewall passivation around the gate, and source and drain with lightly and heavily doped regions;
   a first dielectric layer formed over said semiconductor substrate, said first dielectric layer located adjacent a lower portion of said gate structure, wherein a top surface of the first dielectric layer is located below a top surface of the gate structure;
   a second dielectric etch-stop layer pattern formed over said first dielectric layer, wherein said second dielectric etch-stop layer pattern is located adjacent an upper portion of said gate structure, wherein the second dielectric etch-stop layer directly covers an upper portion of the sidewall passivation to act as an etch-stop for the sidewall passivation;
   a third dielectric layer formed over and in contact with the first dielectric layer and second dielectric etch-stop layer; and
   a contact disposed in the third dielectric layer, the contact contacting said gate structure.

2. A MOSFET device structure according to claim 1 wherein, said first dielectric layer comprises silicon dioxide, nitridized silicon dioxide, silicon oxy-fluoride, and/or tetra-ethyl-ortho-silicate.

3. The MOSFET device structure according to claim 1 wherein, said first dielectric layer thickness is approximately between about 1000° A and 3000° A.

4. The MOSFET device structure according to claim 1 wherein, said second dielectric etch-stop layer comprises silicon nitride, oxygen doped silicon nitride, and/or silicon oxy-nitride.

5. The MOSFET device structure according to claim 1 wherein, said second dielectric etch-stop layer thickness is approximately between about 500° A and 1000° A after planarization process.

6. The MOSFET device structure according to claim 1 wherein, said inter-level dielectric layer thickness is approximately between about 8,000° A and 15,000° A.

7. The MOSFET device structure according to claim 1 wherein, width of said second dielectric etch-stop layer pattern is larger than said gate structure.

8. An integrated circuit (IC) comprising:
   a substrate with a transistor, the transistor having
      a gate with a gate top surface and gate sidewalls and sidewall spacers on the gate sidewalls;
   a lower dielectric layer having a top surface disposed on the substrate, wherein the top surface of the lower dielectric layer is below the gate top surface; and
   an etch-stop with an etch-stop top surface disposed on the top surface of the lower dielectric layer, wherein the etch-stop contacts an upper portion of sidewall spacers on the gate sidewall.

9. The IC of claim 8 further comprising:
   an upper dielectric layer formed on the etch-stop; and
   a contact disposed in the upper dielectric layer which contacts the gate top surface.

10. The IC of claim 9 wherein the etch stop comprises an etch stop top surface which is coplanar with the gate top surface.

11. The IC of claim 9 wherein the etch stop covers a portion of the lower dielectric layer and the upper dielectric layer contacts the lower dielectric layer and etch stop.

12. The IC of claim 11 wherein the etch stop comprises an etch stop top surface which is coplanar with the gate top surface.

13. The IC of claim 8 wherein the etch stop covers a portion of the lower dielectric layer and the upper dielectric layer contacts the lower dielectric layer and etch stop.

14. The IC of claim 13 wherein the etch stop comprises an etch stop top surface which is coplanar with the gate top surface.

15. The IC of claim 8 wherein the etch stop comprises an etch stop top surface which is coplanar with the gate top surface.

16. A transistor comprising:
a gate formed on a substrate, the gate having a gate top surface and sidewalls;
sidewall spacers on the sidewalls of the gate;
a lower dielectric layer having a top surface below the gate top surface; and
an etch stop layer on the top surface of the lower dielectric layer, the etch stop layer contacting an upper portion of the sidewall spacers.

17. The transistor of claim 16 further comprising an upper dielectric layer disposed on the etch-stop.

18. The transistor of claim 17 wherein the etch stop comprises an etch stop top surface which is coplanar with the gate top surface.

19. The transistor of claim 17 wherein the etch stop covers a portion of the lower dielectric layer and the upper dielectric layer contacts the lower dielectric layer and etch stop.

20. The transistor of claim 19 wherein the etch stop comprises an etch stop top surface which is coplanar with the gate top surface.

21. The transistor of claim 16 wherein the etch stop covers a portion of the lower dielectric layer and the upper dielectric layer contacts the lower dielectric layer and etch stop.

22. The transistor of claim 21 wherein the etch stop comprises an etch stop top surface which is coplanar with the gate top surface.

23. The transistor of claim 16 wherein the etch stop comprises an etch stop top surface which is coplanar with the gate top surface.

* * * * *